United States Patent
Lu

(10) Patent No.: US 8,407,572 B2
(45) Date of Patent: Mar. 26, 2013

(54) VITERBI DECODER AND WRITING AND READING METHOD

(75) Inventor: Keng-Chih Lu, Taipei County (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 309 days.

(21) Appl. No.: 12/839,413

(22) Filed: Jul. 20, 2010

(65) Prior Publication Data

US 2011/0283170 A1 Nov. 17, 2011

(30) Foreign Application Priority Data

May 17, 2010 (TW) .............................. 99115685 A

(51) Int. Cl.
*H03M 13/03* (2006.01)
*H04L 5/12* (2006.01)
*H04L 23/02* (2006.01)

(52) U.S. Cl. ......... 714/795; 714/796; 375/262; 375/341

(58) Field of Classification Search .................. None
See application file for complete search history.

(56) References Cited

U.S. PATENT DOCUMENTS

| | | | | |
|---|---|---|---|---|
| 5,291,499 A | * | 3/1994 | Behrens et al. | 714/796 |
| 5,828,675 A | * | 10/1998 | Chen et al. | 714/745 |
| 5,983,383 A | * | 11/1999 | Wolf | 714/755 |
| 6,445,755 B1 | * | 9/2002 | Chung et al. | 375/341 |
| 6,697,443 B1 | * | 2/2004 | Kim et al. | 375/341 |
| 6,901,118 B2 | * | 5/2005 | Hocevar et al. | 375/341 |
| 7,864,895 B1 | * | 1/2011 | Han et al. | 375/341 |
| 8,230,311 B2 | * | 7/2012 | Lin et al. | 714/795 |
| 2005/0089121 A1 | * | 4/2005 | Tsai et al. | 375/341 |
| 2006/0161834 A1 | * | 7/2006 | Saito et al. | 714/780 |
| 2007/0113161 A1 | * | 5/2007 | Lingam et al. | 714/796 |

FOREIGN PATENT DOCUMENTS

EP 0 926 836 B1 10/2003

OTHER PUBLICATIONS

Feygin, G.; Gulak, P.; "Architectural tradeoffs for survivor sequence memory management in Viterbi decoders," IEEE Transactions on Communications, vol. 41, No. 3, pp. 425-429, Mar. 1993.

* cited by examiner

*Primary Examiner* — Guerrier Merant
(74) *Attorney, Agent, or Firm* — Winston Hsu; Scott Margo

(57) ABSTRACT

A Viterbi decoder includes a survival memory unit, for storing a plurality of survivor metric into a writing column of a writing bank of a plurality of banks in alternating intervals of a clock according to a writing bank order and a writing column order, and a trace back unit, for reading a reading column of each bank not performing storing operations according to a reading bank order and a reading column order in every interval of the clock.

20 Claims, 10 Drawing Sheets

VITERBI DECODER AND WRITING AND READING METHOD

BACKGROUND OF THE INVENTION

1. Field of the Invention

The present invention relates to a Viterbi decoder and a storing and reading method, and more particularly, to a Viterbi decoder and a storing and reading method capable of effectively reducing the amount of memory used.

2. Description of the Prior Art

Maximum likelihood sequence estimation, or MLSE, has been widely used in a variety of digital decoders, where a Viterbi detector is one example of a circuit for detecting convolution codes based on MLSE. As those skilled in the art will recognize, a communication channel always includes additive white Gaussian noise (or AWGN), or other forms of interference, so that a communication system encodes data before transmission for decreasing detection errors after the data is received. For example, via application of a specific algorithm, a given amount of data is convoluted to include more data bits before transmission. As a result, the communication system can detect whether the received data is correct according to the algorithm, and can even correct erroneous bits in the data.

Please refer to FIG. 1, which is a functional block diagram of a conventional Viterbi decoder 10. The Viterbi decoder 10 includes a branch metric generator 102, an add-compare-select unit 104, a survival memory unit 106, a trace back unit 108 and a last in first out buffer 110. The branch metric generator 102 receives and converts a data sequence Data_seq into soft decision information, and outputs branch metrics to the add-compare-select unit 104 accordingly. The add-compare-select unit 104 generates path metrics and survivor metrics of all states according to the branch metrics, and writes the survivor metrics into the survival memory unit 106. The trace back unit 108 reads the survivor metrics stored in the survival memory unit 106 to trace back, and outputs decoded data to the last in first out buffer 110 after tracing back beyond a predefined path depth, i.e. a path is converged. The last in first out buffer 110 outputs first stored data last (i.e. an input order is in reverse to an output order) to generate a decoded data sequence Dec_seq.

For operations of the Viterbi decoder 10, please refer to FIG. 2, which is a schematic diagram of a conventional Trellis tree of Viterbi algorithm with four states S00, S01, S10, and S11. The Trellis tree in FIG. 2 includes four current states S00, S01, S10, and S11 corresponding to a data Data_x of the data sequence Data_seq, four previous states S00', S01', S10', and S11' corresponding to a previous data Data_x−1 of the data sequence Data_seq, and branches in-between. Each branch indicates a relation between each current state and each previous state when 1 or 0 is encoded. When the Viterbi decoder 10 receives the data Data_x, the branch metric generator 102 calculates branch metrics corresponding to each branch, and then the add-compare-select unit 104 determines a path metric and a survivor metric of each current state according to the branch metrics and a previous path metric accumulated by a plurality of previous branch metrics. The path metric of each current state is calculated as follows:

$$P_{S00} = \min\{(P_{S00'} + B_{S00' \to S00}), (P_{S01'} + B_{S01' \to S00})\} \quad \text{(Eq. 1)}$$

$$P_{S10} = \min\{(P_{S00'} + B_{S00' \to S10}), (P_{S01'} + B_{S01' \to S10})\} \quad \text{(Eq. 2)}$$

$$P_{S01} = \min\{(P_{S10'} + B_{S10' \to S01}), (P_{S11'} + B_{S11' \to S01})\} \quad \text{(Eq. 3)}$$

$$P_{S11} = \min\{(P_{S10'} + B_{S10' \to S11}), (P_{S11'} + B_{S11' \to S11})\} \quad \text{(Eq. 4)}$$

Please refer to FIG. 3, which is a schematic diagram of the add-compare-select unit 104 in FIG. 1. The add-compare-select unit 104 includes adders 302, 304, a comparator 306 and a multiplexer 308. The adders 302, 304 adds branch metrics $B_{S00' \to S00}$ and $B_{S01' \to S00}$ with path metrics $P_{S00'}$ and $P_{S01'}$ of previous states S00' and S01', respectively, to generate adding results Add1 and Add2. The comparator 306 outputs a survivor metric Sur to the multiplexer 308 according to the adding results Add1 and Add2, to reflect a comparing result. The multiplexer 308 selects to output the smaller of the adding results Add1 and Add2 as a path metric $P_{S00}$ according to the survivor metric Sur. Similarly, calculating circuits for other path metrics have the same structure and operations of the circuit in FIG. 3, and are not narrated hereinafter. Noticeably, when a new data of the data sequence Data_seq is entered, states of a previous data becomes previous states of the new data and path metrics of current states are simultaneously updated.

For writing and reading operations of the Viterbi decoder 10, please refer to FIG. 4, which is a schematic diagram of writing and reading operations when the survival memory unit 106 in FIG. 1 performs sequential writing in the prior art. The survival memory unit 106 includes banks Bank_1~Bank_4. The banks Bank_1~Bank_4 further include columns Col_1~Col_n, respectively. The columns Col_1~Col_n store survivor metrics of each state corresponding to each data of the data sequence Data_seq, respectively. The add-compare-select unit 104 performs writing operations with writing banks wr. The trace back unit 108 performs reading operations with trace back banks tb and decoding banks dc, i.e. decoding after tracing back beyond a predefined path depth, which is a depth of two banks in FIG. 4. Since both tracing back and decoding are reading operations, a ratio of a writing speed to a reading speed is 1:3. As shown in FIG. 4, the prior art utilizes sequential writing, and thus the add-compare-select unit 104 performs writing operations first from a column Col_1 of bank Bank_1 to a column Col_n of the banks Bank_1, and goes to write a column Col_1 of the bank Bank_2 after writing the column Col_n of the banks Bank_1. The trace back unit 108 has to perform reading operations according to an order in reverse to the writing order, i.e. performing trace back operations first from a column Col_n of the bank Bank_4 to a column Col_1 of the bank Bank_4, and goes to trace back a column Col_n of the bank Bank_3 after tracing back the column Col_1 of the bank Bank_4, whereby decoding is started after tracing back beyond the predefined path depth.

Since the trace back unit 108 reads data according to the reading order in reverse to the writing order when performing tracing back and decoding operations, only one memory bank is utilized for writing operations, another memory bank is utilized for reading operations, and the remaining two memory banks are idle in every interval of a clock, causing low memory efficiency. Besides, in order to use less memory, memory may be divided into more banks to increase a ratio of a reading speed to a writing speed in the prior art, but path delay will be increased and more memory is required when memory is divided into too many banks. Thus, there is a need for improvement in the prior art.

SUMMARY OF THE INVENTION

It is therefore an objective of the present invention to provide a Viterbi decoder and storing and reading method.

The present invention discloses a Viterbi decoder capable of effectively reducing the amount of memory used. The Viterbi decoder includes a survival memory unit, comprising a plurality of banks, for storing a plurality of survivor metrics corresponding to a plurality of states into a writing column of a writing bank of the plurality of banks according to a writing bank order and a writing column order in alternating intervals of a clock, and a trace back unit, coupled to the survival memory unit, for reading a reading column of each bank of the plurality of banks not performing storing operations according to a reading bank order and a reading column order in reverse to the writing bank order and the writing column order in every interval of the clock.

The present invention further discloses a writing and reading method for a Viterbi decoder, capable of effectively reducing the amount of memory used. The writing and reading method includes steps of storing a plurality of survivor metrics corresponding to a plurality of states into a writing column of a writing bank of the plurality of banks according to a writing bank order and a writing column order in alternating intervals of a clock, and reading a reading column of each bank of the plurality of banks not performing storing operations according to a reading bank order and a reading column order in reverse to the writing bank order and the writing column order in every interval of the clock.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
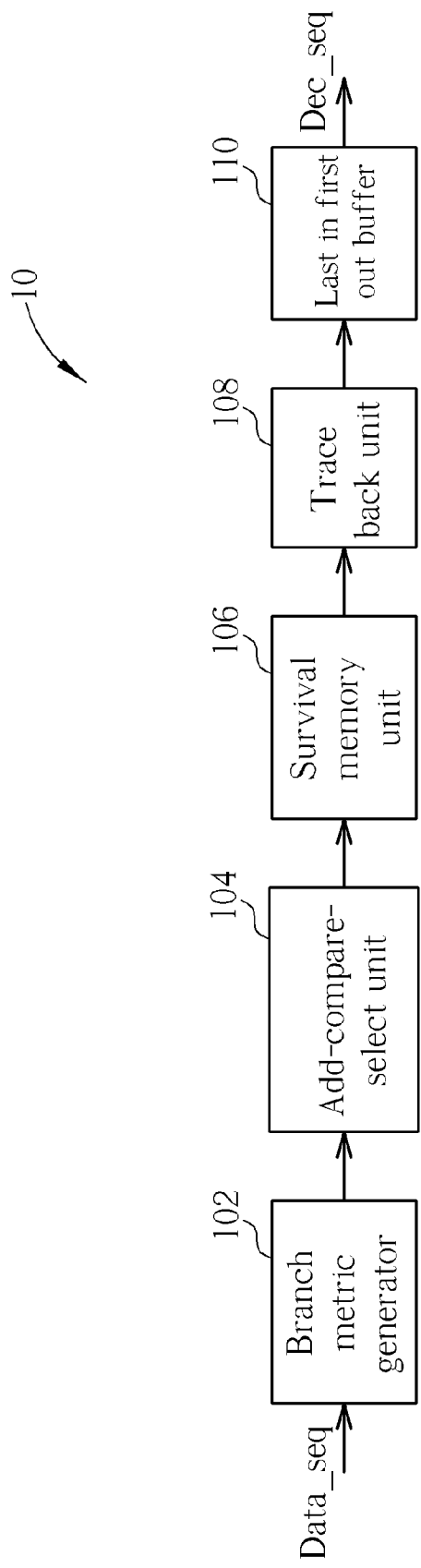
FIG. 1 is a functional block diagram of a conventional Viterbi decoder.
Figure 2:
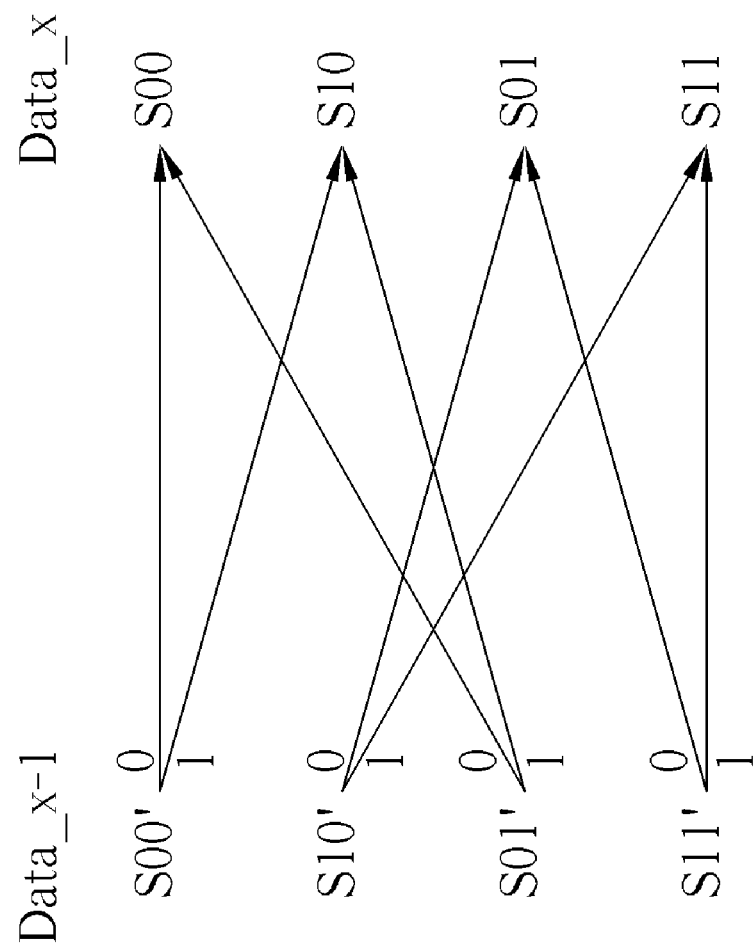
FIG. 2 is a schematic diagram of a conventional Trellis tree of Viterbi algorithm with four states.
Figure 5:
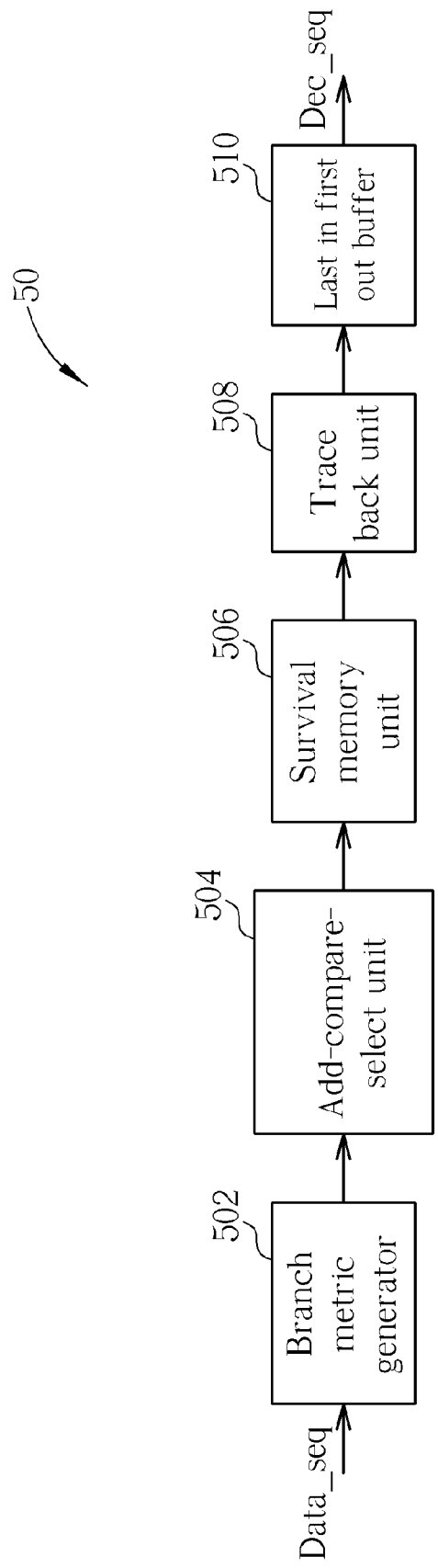
FIG. 5 is a functional block diagram of a Viterbi decoder performing distributed writing operations according to an embodiment of the present invention.

Please refer to FIG. 5, which is a functional block diagram of a Viterbi decoder 50 performing distributed writing operations according to an embodiment of the present invention. The Viterbi decoder 50 includes a branch metric generator 502, an add-compare-select unit 504, a survival memory unit 506, a trace back unit 508 and a last in first out buffer 510. By comparing FIG. 5 with FIG. 1, it can be seen that the structure of the Viterbi decoder 50 is the same as that of the Viterbi decoder 10. However, differences between the Viterbi decoder 50 and the Viterbi decoder 10 are that the add-compare-select unit 504 performs distributed writing with the survival memory unit 506, i.e. the add-compare-select unit 504 goes to perform writing operations with a writing column of a next writing bank of the survival memory unit 506 after writing one writing column of a current writing bank of the survival memory unit 506. As a result, the trace back unit 508 can perform reading operations with a reading column of each bank of the survival memory unit 506 not performing storing operations at the same time, to increase memory efficiency so as to effectively use less memory required by the last in first out buffer 510.

Figure 6:
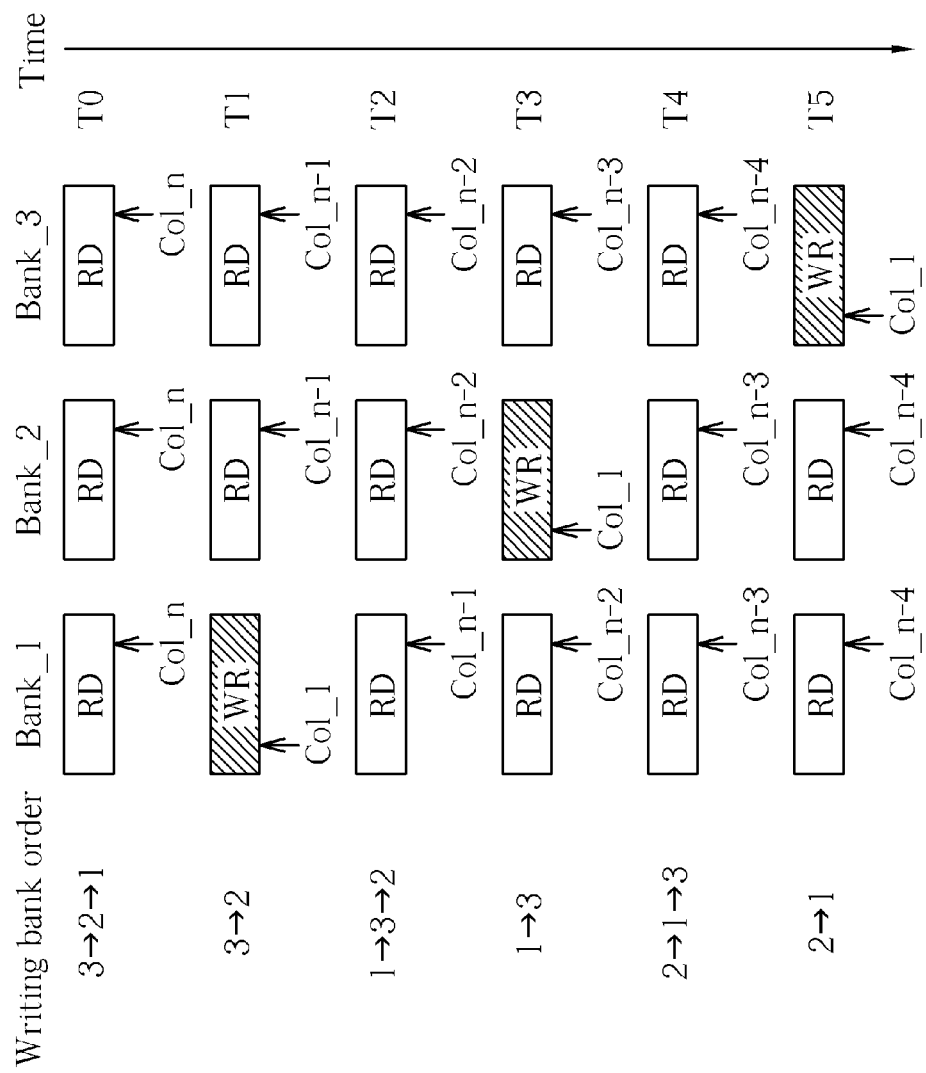
FIG. 6 is a schematic diagram of writing and reading operations when a survival memory unit in FIG. 5 performs distributed writing operations according to an embodiment of the present invention.

In detail, please refer to FIG. 6, which is a schematic diagram of writing and reading operations when the survival memory unit 506 in FIG. 5 performs distributed writing operations according to an embodiment of the present invention. As shown in FIG. 6, the survival memory unit 506 includes banks Bank_1~Bank_3. Each of the banks Bank_1~Bank_3 further includes columns Col_1~Col_n. The add-compare-select unit 504 writes survivor metrics corresponding to each state into a writing column of a writing bank WR of the banks Bank_1~Bank_3 according to a writing bank order and a writing column order in alternating intervals of a clock. That is, in intervals T1, T3, T5 . . . , the add-compare-select unit 504 writes a survivor metric of each state into the survival memory unit 506 according to an order of the column Col_1 of the bank Bank_1→the column Col_1 of the bank Bank_2→the column Col_1 of the bank Bank_3→the column Col_2 of the Bank_1 . . . , respectively. The trace back unit 508 reads a reading column of each reading bank RD of the banks Bank_1~Bank_3 not performing storing operations according to a reading bank order and a reading column order in reverse to the writing bank order and the writing column order in every interval of the clock. That is, in an interval T0, the trace back unit 508 performs reading operations according to an order of the column Col_n of the bank Bank_3→the column Col_n of the bank Bank_2→the column Col_n of the bank Bank_1; in an interval T1, the trace back unit 508 performs reading operations according to an order of the column Col_n−1 of the bank Bank_3→the column Col_n−1 of the bank Bank_2; in an interval T2, the trace back unit 508 performs reading operations according to an order of the column Col_n−1 of the bank Bank_1→the column Col_n−2 of the bank Bank_3→the column Col_n−2 of the bank Bank_2, and so no. Noticeably, in the interval T1, since the add-compare-select unit 504 performs writing operations with the bank Bank_1, the trace back unit 508 does not perform reading operations with the column Col_n−1 of the bank Bank_1; and then the trace back unit 508 starts performing reading operations from the column Col_n−1 of the bank Bank_1 reading in the interval T2 according to the reading bank order and the reading column order. In such a situation, since there is only one writing operation in every two intervals, a ratio of a writing speed to a reading speed is equivalent to 1:5. As a result, the present invention increases memory efficiency, so as to effectively use less memory as compared to the prior art.

Figure 3:
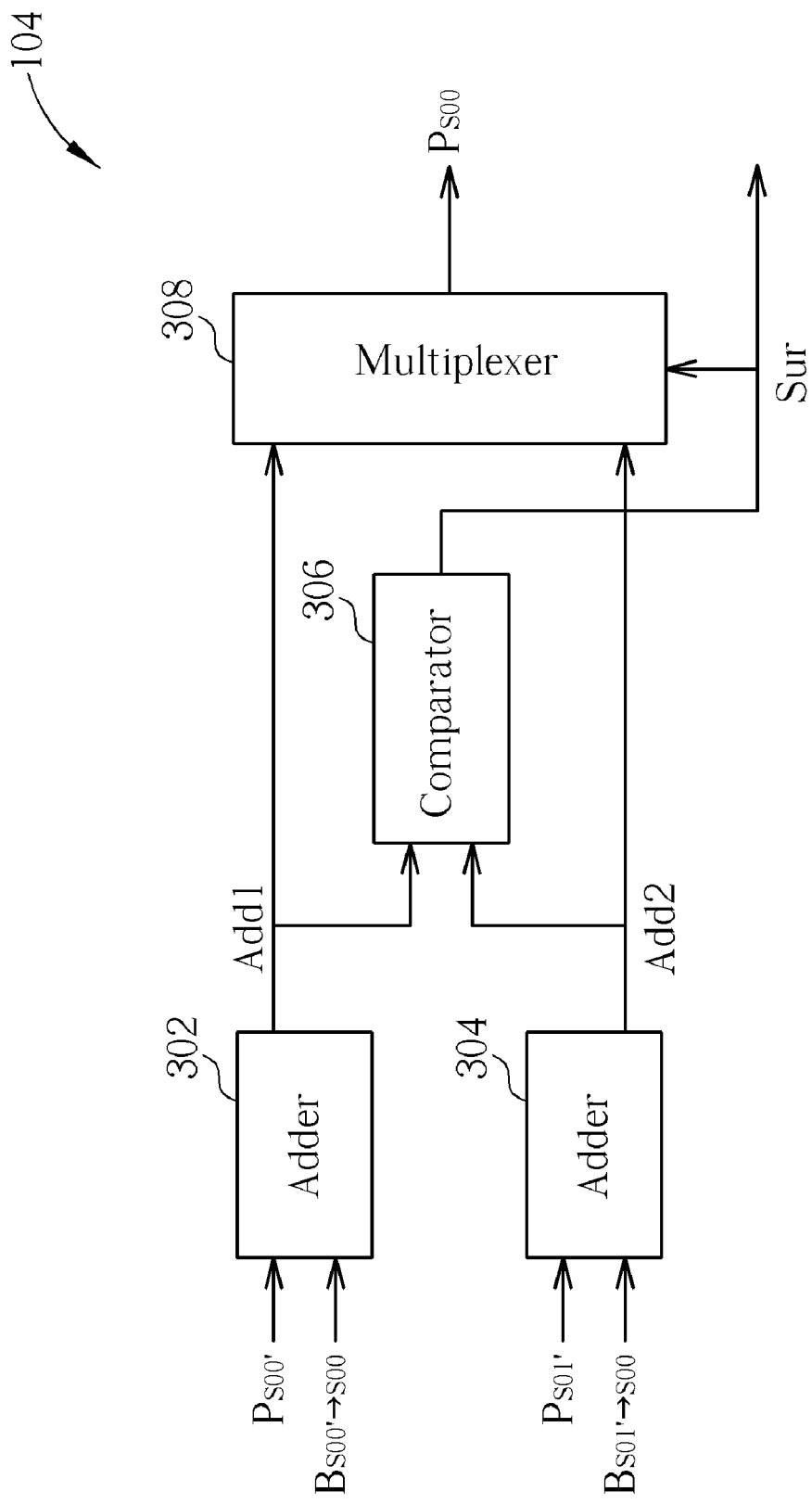
FIG. 3 is a schematic diagram of an add-compare-select unit in FIG. 1.
Figure 4:
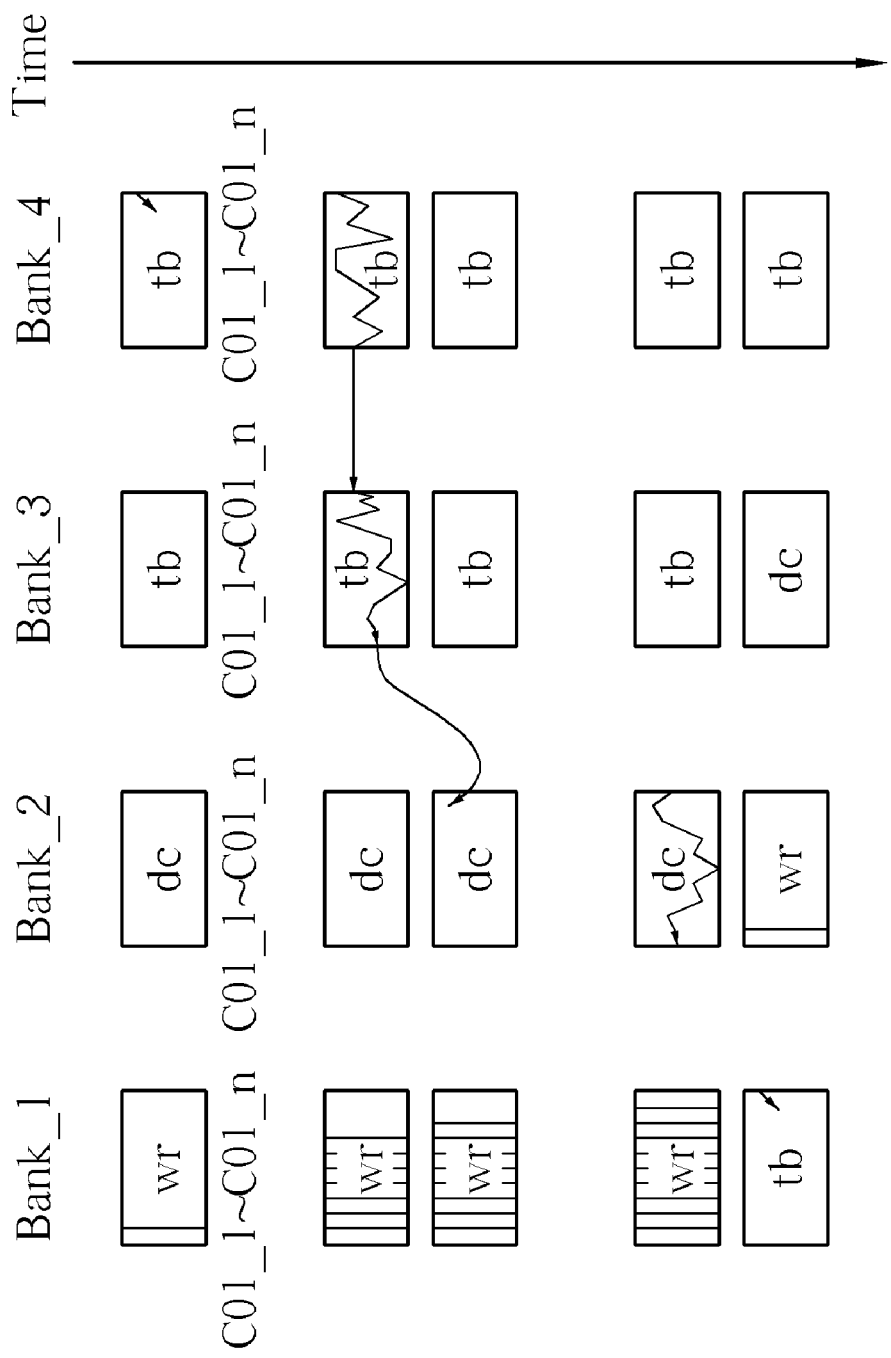
FIG. 4 is a schematic diagram of writing and reading operations when a survival memory unit in FIG. 1 performs sequential writing in the prior art.
Figure 7:
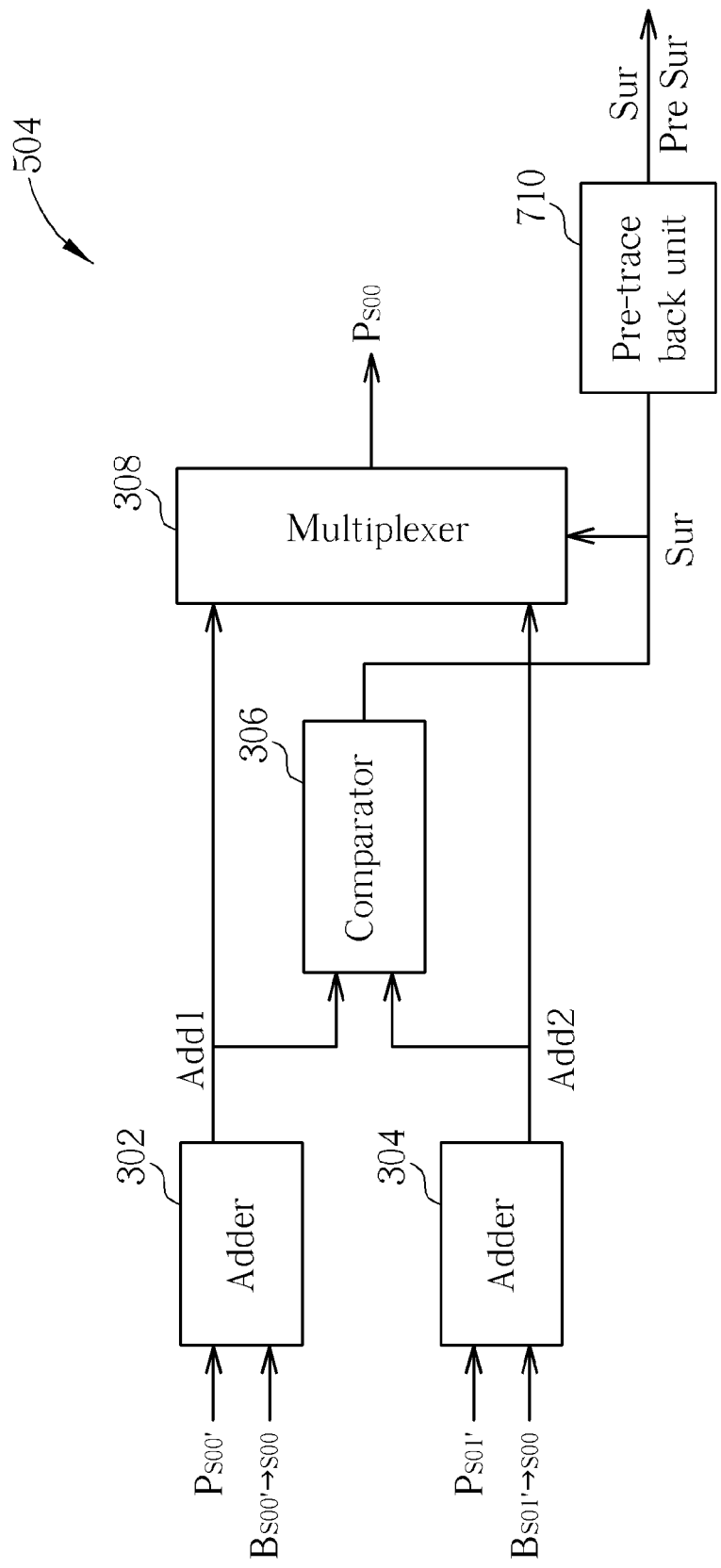
FIG. 7 is a schematic diagram of an add-compare-select unit in FIG. 5 according to an embodiment of the present invention.

In addition, please refer to FIG. 7, which is a schematic diagram of the add-compare-select unit 504 in FIG. 5 according to an embodiment of the present invention. For clear illustration, elements with the same function and structure of those shown in FIG. 3 are denoted by the same figures and symbols in FIG. 7. Differences between the add-compare-select unit 504 and the add-compare-select unit 104 are that the add-compare-select unit 504 further includes a pre-trace back unit 710, for pre-tracing back to generate a previous survivor metric PreSur according to the survivor metric Sur, and the add-compare-select unit 504 can write both the previous survivor metric PreSur and the survivor metric Sur into a writing column of a writing bank WR in the alternating intervals, such that the trace back unit 508 can simultaneously read both the survivor metric Sur and the previous survivor metric PreSur, i.e. tracing back two data of the data sequence Data_seq at once, so as to trace back at a double speed. As a result, although the ratio of a writing speed to a reading speed is 1:3 in the prior art, and the ratio of a writing speed to a reading speed is 1:5 in the present invention, path delay in the present invention can be reduced to be the same with path delay when the ratio of a writing speed to a reading speed is 1:3 in the prior art, so as to reduce path delay, since the pre-trace back unit 710 can perform pre-tracing back operations, such that the trace back unit 508 can trace back at a double speed. Moreover, although the add-compare-select unit 504 writes both the previous survivor metric PreSur and the survivor metric Sur into the survival memory unit 506 such that a length of a column is double, less memory is used since memory is used more efficiently.

Taking digital video broadcasting over satellite (DVB-S) system as an example, Viterbi encoding of the DVB-S system has 64 states, and assume that the path is converged when path depth is more than 160. In such a situation, in the prior art, when the ratio of a writing speed to a reading speed is 1:3 (i.e. a writing speed: a decoding speed: a tracing back speed is 1:1:2), a minimum width of each bank (i.e. path depth divided by the tracing back speed) multiplying an amount of banks and multiplying a length of a column is an amount of memory, i.e. (160/2)*4*64 bits. Similarly, path delay when the ratio of a writing speed to a reading speed is 1:5 in the present invention is the same with path delay when the ratio of a writing speed to a reading speed is 1:3 in the prior art, whereas an amount of memory is (160/4)*3*64*2 bits in the present invention, and is only three quarters of that in the prior art. As can be seen from the above, the present invention can increase memory efficiency, so as to effectively use less memory than in the prior art. Furthermore, by comparing that the last in first out buffer 110 requires memory of (160/2)*2 bits, the last in first out buffer 510 the present invention only requires memory of (160/4)*2 bits, which is also less than that in the prior art.

Figure 8:
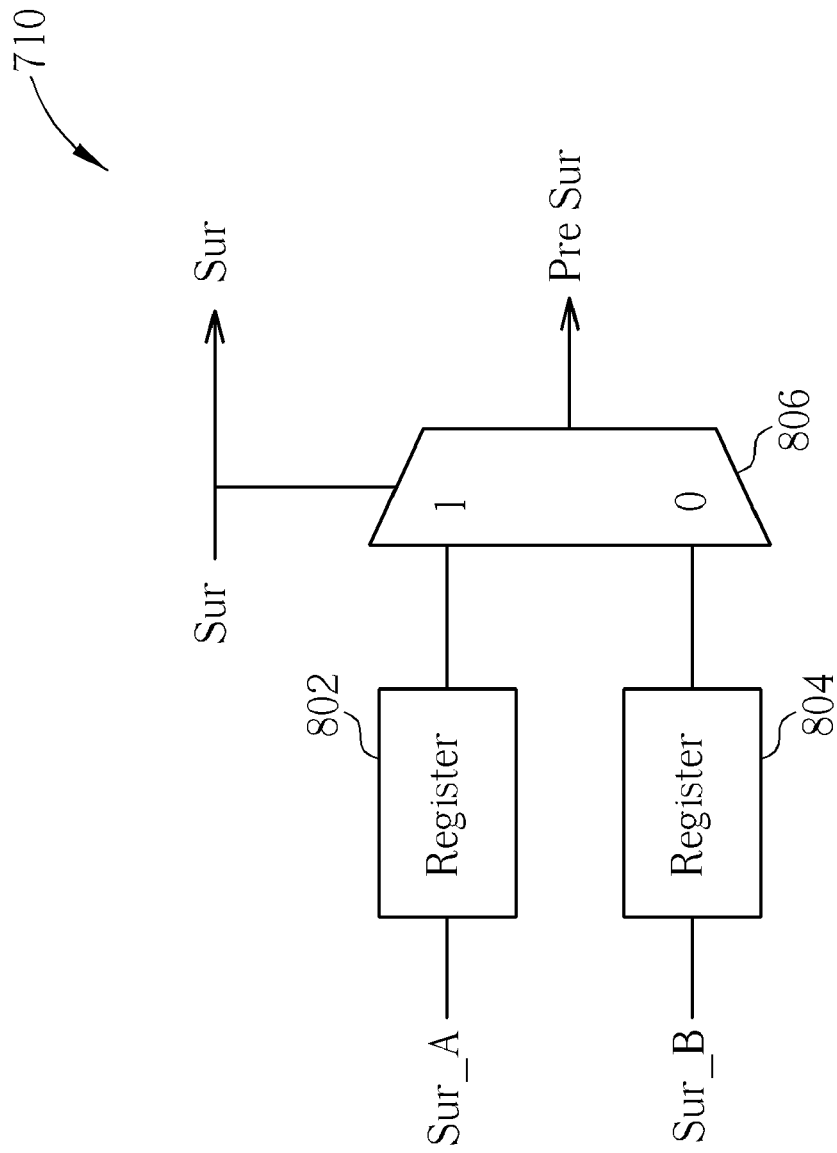
FIG. 8 is a schematic diagram of a pre-trace back unit in FIG. 7.

In addition, realization of the pre-trace back unit 710 can be demonstrated by referring to FIG. 8, which is a schematic diagram of the pre-trace back unit 710 in FIG. 7. The pre-trace back unit 710 includes registers 802, 804 and a multiplexer 806. The registers 802, 804 store the survivor metrics Sur_A, Sur_B of previous states, respectively, and the multiplexer 806 determines to output the survivor metric Sur_A or Sur_B as the previous survivor metric PreSur according to the survivor metric Sur. For example, if previous state S00' corresponds to a survivor metric of the current state S00, the multiplexer 806 outputs a survivor metric of the previous state S00' as the previous survivor metric PreSur. As a result, the pre-trace back unit 710 can perform pre-tracing back operations, to generate the previous survivor metric PreSur, such that the add-compare-select unit 504 can write both the previous survivor metric PreSur and the survivor metric Sur into a writing column of a writing bank WR.

Figure 9:
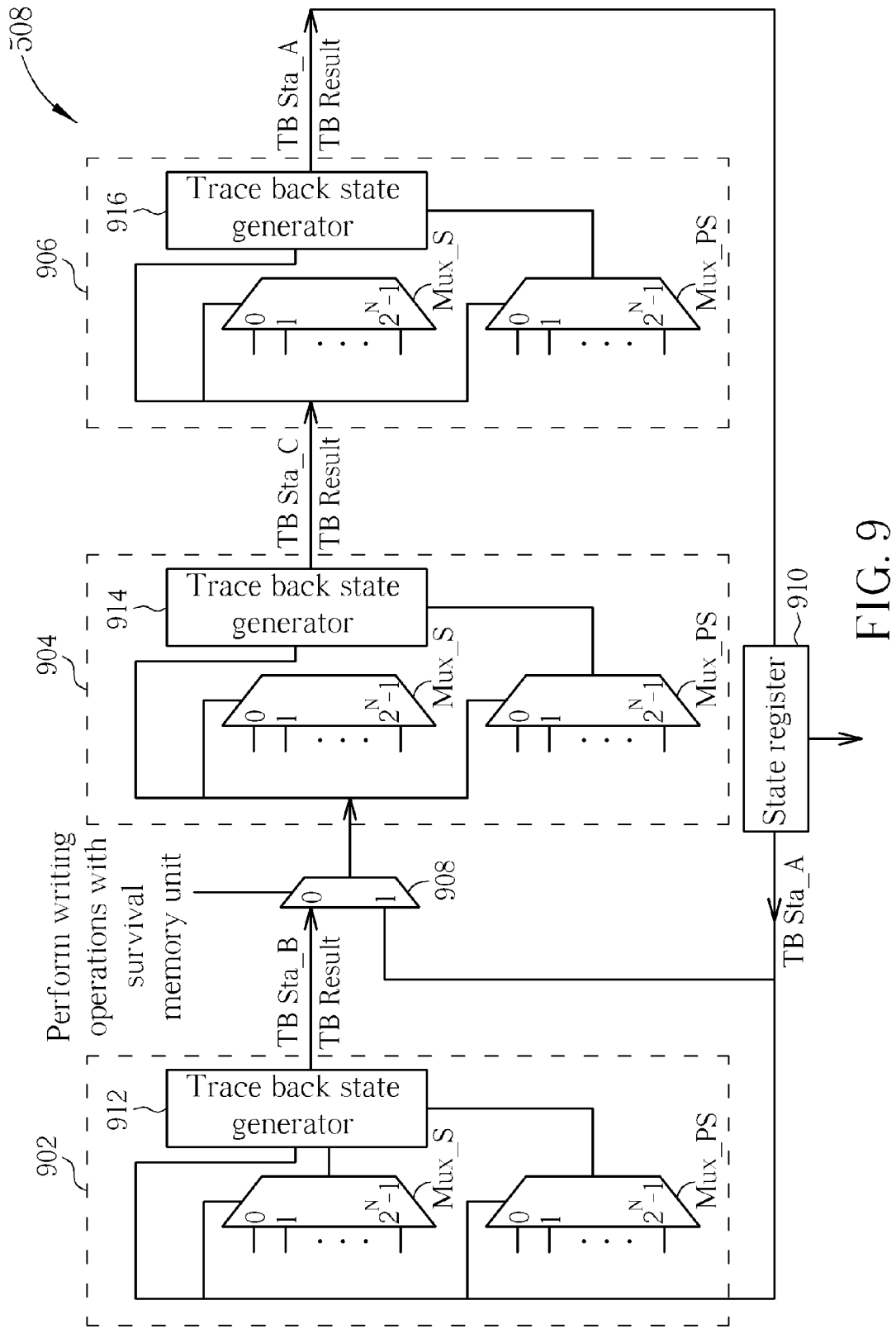
FIG. 9 is a schematic diagram of a trace back unit in FIG. 5.

Realization of the trace back unit 508 can be demonstrated by referring to FIG. 9, which is a schematic diagram of the trace back unit 508 in FIG. 5. The trace back unit 508 includes trace back elements 902, 904, and 906, an interval selector 908 and a state register 910. The state register 910 outputs a trace back state TBSta_A to the trace back element 902, to indicate a starting state for tracing back. The trace back element 902 includes multiplexers Mux_S, Mux_PS and a trace back state generator 912. The multiplexers Mux_S, Mux_PS output the survivor metric Sur and the previous survivor metric PreSur corresponding to the trace back states TBSta_A in a reading column according to trace back states TBSta_A, respectively. The trace back state generator 912 generates a trace back state TBSta_B and a trace back result TBResult to a next trace back element. By the same token, the trace back elements 904, 906 can generate trace back states TBSta_C, TBSta_A and trace back result TBResult to the trace back element 906 and the state register 910, respectively. The trace back unit 508 outputs the trace back result TBResult as decoded data to the last in first out buffer 510 when tracing back beyond a predefined path depth, to generate a decoded data sequence Dec_seq. Furthermore, the interval selector 908 skips operations of the trace back element 902 in alternating intervals, i.e. intervals T1, T3, T5 . . . , since the trace back unit 508 does not read a writing bank and thus one trace back operation is skipped in alternating intervals. Therefore, the trace back element 904 is inputted with the trace back state TBSta_A outputted by the state register 910 as a starting state for tracing back in alternating intervals.

Noticeably, the spirit of the present invention is to perform distributed writing with the survival memory unit 506 to increase memory efficiency, so as to effectively use less memory, and the add-compare-select unit 504 can perform pre-tracing back, to write both a previous survivor metric and a survivor metric into a writing column of a writing bank at the same time, such that the trace back unit 508 can simultaneously read a survivor metric and a previous survivor metric, i.e. tracing back two data of the data sequence Data_seq at once, so as to trace back at a double speed, and equivalently reduce path delay. Those skilled in the art should make modifications or alterations accordingly. For example, pre-tracing back operations are utilized for reducing path delay to be equivalent to path delay with a slower reading speed in the prior art for distributed writing, and are not required for distributed writing. In other words, when performing distributed writing without pre-tracing back, the add-compare-select unit 504 does not include the pre-trace back unit 710, and the trace back elements 902, 904, and 906 do not include multiplexers Mux_PS. Moreover, realizations of the pre-trace back unit 710 and the trace back elements 902, 904, and 906 are not limited to the embodiments described above, as long as the same functions can be achieved. When the trace back element 906 does not generate the trace back state TBSta_A to be stored in the state register 910 in initial operations, since the path is converged after tracing back beyond a predefined path depth, the state register 910 can take any state as the initial trace back state TBSta_A.

Figure 10:
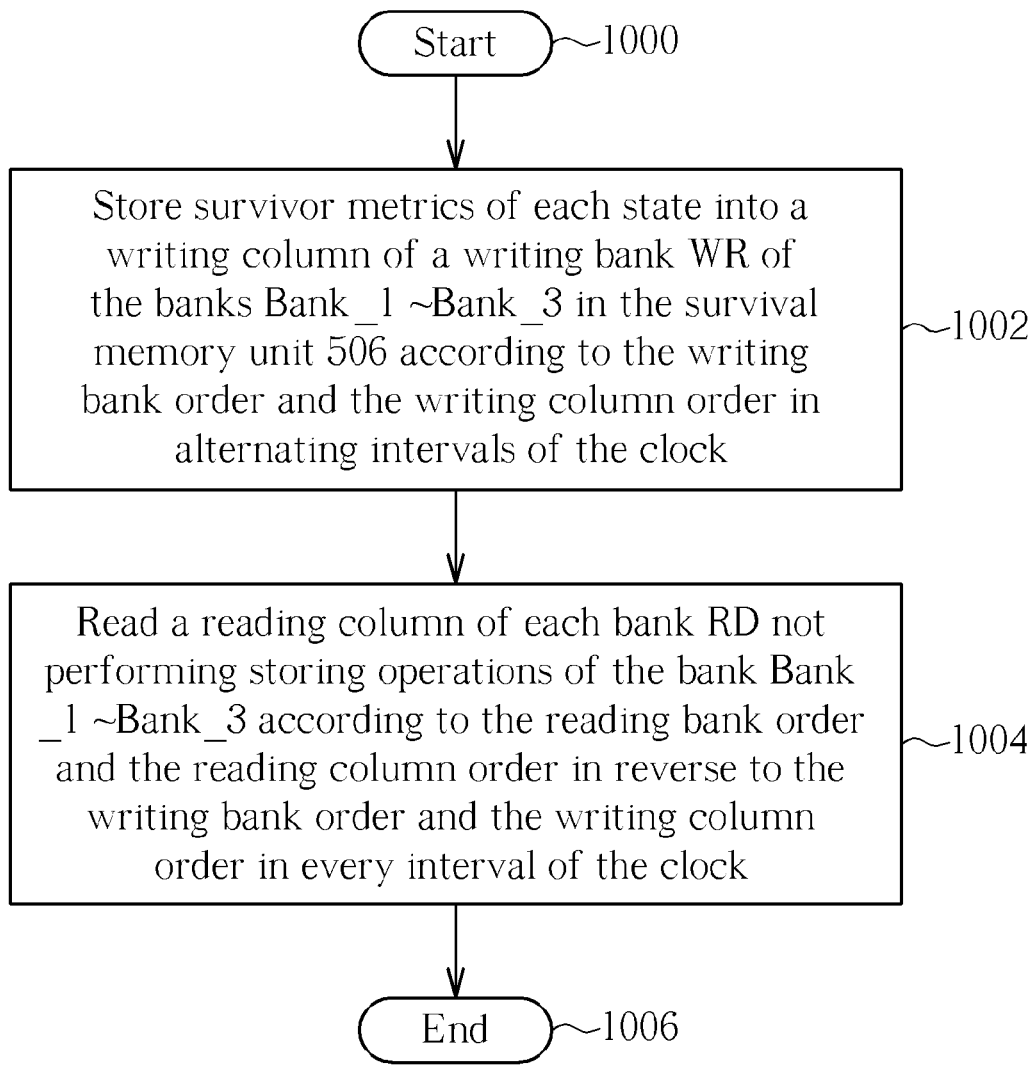
FIG. 10 is a schematic diagram of a writing and reading process according to an embodiment of the present invention.

Reading and writing operations of the Viterbi decoder 50 performing distributed writing can be summarized into a writing and reading process 100 as shown in FIG. 10. The writing and reading process 100 includes the following steps:

Step 1000: Start.

Step 1002: Store survivor metrics of each state into a writing column of a writing bank WR of the banks Bank_1~Bank_3 in the survival memory unit 506 according to the writing bank order and the writing column order in alternating intervals of the clock Step 1004: Read a reading column of each bank RD not performing storing operations of the bank Bank_1~Bank_3 according to the reading bank order and the reading column order in reverse to the writing bank order and the writing column order in every interval of the clock.

Step 1006: End.

Operations of the writing and reading process 100 can be found by referring to the above description, and are therefore not narrated hereinafter.

In the prior art, the Viterbi decoder 10 performs sequential writing, such that memory efficiency is low when the trace back unit 108 performs trace back decoding. Although memory can be divided into more banks to use less memory, path delay will be increased and more memory is required when memory is divided into too many banks. In comparison, in the present invention, the Viterbi decoder 50 performs distributed writing and pre-tracing back, to increase memory efficiency, so as to effectively use less memory. Furthermore, the trace back unit 508 can simultaneously read a survivor metric and a previous survivor metric, so as to trace back at a double speed, equivalently reducing path delay.

To sum up, the present invention can increase memory efficiency, effectively use less memory, and trace back at a double speed, equivalently reducing path delay.

Those skilled in the art will readily observe that numerous modifications and alterations of the device and method may be made while retaining the teachings of the invention.

What is claimed is:

1. A Viterbi decoder capable of effectively reducing the amount of memory used in operations, comprising:
   a survival memory unit, comprising a plurality of banks, for storing a plurality of survivor metrics corresponding to a plurality of states into a writing column of a writing bank of the plurality of banks according to a writing bank sequence and a writing column sequence in alternating intervals of a clock; and
   a trace back unit, coupled to the survival memory unit, for reading a reading column of each bank of the plurality of banks not performing storing operations according to a reading bank sequence and a reading column sequence in reverse to the writing bank sequence and the writing column sequence in every interval of the clock, comprising:
      a plurality of trace back elements, each for reading a survivor metric corresponding to the first trace back state in a first reading column according to a first trace back state, to output a second trace back state to another trace back element; and
      an interval selector, for skipping operations of one trace back element in alternating intervals of the clock.

2. The Viterbi decoder of claim 1 further comprising an add-compare-select unit, coupled to the survival memory unit, for generating the plurality of survivor metrics.

3. The Viterbi decoder of claim 2, wherein the add-compare-select unit comprises:
   a first adder, for adding a first branch metric of a first previous state to a first path metric, to generate a first adding result;
   a second adder, for adding a second branch metric of a second previous state to a second path metric, to generate a second adding result;
   a comparator, coupled to the first adder and the second adder, for comparing the first adding result with the second adding result, to generate a survivor metric; and
   a multiplexer, coupled to the comparator, for generating a path metric according to the survivor metric.

4. The Viterbi decoder of claim 2, wherein the add-compare-select unit is further utilized for pre-tracing back to a plurality of previous states of the plurality of states according to the plurality of survivor metrics, and acquiring a plurality of previous survivor metrics of the plurality of previous states, to output the plurality of previous survivor metrics.

5. The Viterbi decoder of claim 4, wherein the survival memory unit further stores the plurality of previous survivor metrics into the writing column of the writing bank.

6. The Viterbi decoder of claim 4, wherein the add-compare-select unit comprises:
   a first adder, for adding a first branch metric of a first previous state to a first path metric, to generate a first adding result;
   a second adder, for adding a second branch metric of a second previous state to a second path metric, to generate a second adding result;
   a comparator, coupled to the first adder and the second adder, for comparing the first adding result with the second adding result, to generate a survivor metric;
   a first multiplexer, coupled to the comparator, for generating a path metric according to the survivor metric; and
   a pre-trace back unit, coupled to the first multiplexer, for generating a previous survivor metric according to the survivor metric.

7. The Viterbi decoder of claim 6, wherein the pre-trace back unit further comprises:
   a first register, for storing a first survivor metric of the first previous state;
   a second register, for storing a second survivor metric of the second previous state; and
   a second multiplexer, coupled to the first register and the second register, for outputting the previous survivor metric according to the survivor metric, the first survivor metric and the second survivor metric.

8. The Viterbi decoder of claim 1, wherein each trace back element comprises:
   a multiplexer, for outputting the survivor metric corresponding to the first trace back state in the first reading column according to the first trace back state; and
   a trace back state generator, for outputting the second trace back state according to the first trace back state and the survivor metric.

9. The Viterbi decoder of claim 4, wherein the trace back unit comprises:
   a plurality of trace back elements, each for reading a survivor metric and a previous survivor metric corresponding to the first trace back state in a first reading column according to a first trace back state, to output a second trace back state to another trace back element; and
   an interval selector, for skipping operations of a trace back element in alternating intervals of the clock.

10. The Viterbi decoder of claim 9, wherein each trace back element comprises:
    a first multiplexer, for outputting the survivor metric corresponding to the first trace back state in the first reading column according to the first trace back state;
    a second multiplexer, for outputting the previous survivor metric corresponding to the first trace back state in the first reading column according to the first trace back state; and
    a trace back states generator, for outputting the second trace back state according to the first trace back state, the survivor metric and the previous survivor metric.

11. A writing and reading method for a Viterbi decoder, capable of effectively reducing the amount of memory used in operations, comprising:
    storing a plurality of survivor metrics corresponding to a plurality of states into a writing column of a writing bank of the plurality of banks according to a writing bank sequence and a writing column sequence in alternating intervals of a clock; and reading a reading column of each bank of the plurality of banks not performing storing operations according to a reading bank sequence and a reading column sequence in reverse to the writing bank sequence and the writing column sequence in every interval of the clock, comprising:

performing a plurality of trace back operations; and skipping a trace back operation in alternating intervals of the clock.

12. The writing and reading method of claim 11 further comprising generating the plurality of survivor metrics.

13. The writing and reading method of claim 12, wherein the step of generating the plurality of survivor metrics comprises:

adding a first branch metric of a first previous state to a first path metric, to generate a first adding result;

adding a second branch metric of a second previous state to a second path metric, to generate a second adding result;

comparing the first adding result with the second adding result, to generate a survivor metric; and generating a path metric according to the survivor metric.

14. The writing and reading method of claim 12 further comprising;

pre-tracing back to a plurality of previous states of the plurality of states according to the plurality of survivor metrics;

acquiring a plurality of previous survivor metrics of the plurality of previous states; and outputting the plurality of previous survivor metrics.

15. The writing and reading method of claim 14 further comprising storing the plurality of previous survivor metrics into the writing column of the writing bank.

16. The writing and reading method of claim 14, wherein the step of pre-tracing back to the plurality of previous states of the plurality of states according to the plurality of survivor metrics further comprises:

adding a first branch metric of a first previous state to a first path metric, to generate a first adding result;

adding a second branch metric of a second previous state to a second path metric, to generate a second adding result;

comparing the first adding result with the second adding result, to generate a survivor metric;

generating a path metric according to the survivor metric; and generating a previous survivor metric according to the survivor metric.

17. The writing and reading method of claim 16, wherein the step of generating the previous survivor metric according to the survivor metric comprises:

storing a first survivor metric of the first previous state;

storing a second survivor metric of the second previous state; and outputting the previous survivor metric according to the survivor metric, the first survivor metric and the second survivor metric.

18. The writing and reading method of claim 1, wherein each trace back operation comprises reading a survivor metric corresponding to the first trace back state in a first reading column according to a first trace back state, to output a second trace back state to another trace back operation.

19. The writing and reading method of claim 14, wherein the step of reading the reading column of each bank of the plurality of banks not performing storing operations according to the reading bank sequence and the reading column sequence in reverse to the writing bank sequence and the writing column sequence in every interval of the clock further comprises:

performing a plurality of trace back operations; and skipping a trace back operation in alternating intervals of the clock.

20. The writing and reading method of claim 19, wherein each trace back operation comprises reading a survivor metric and a previous survivor metric corresponding to the first trace back state in a first reading column according to a first trace back state, to output a second trace back state to another trace back operation.

* * * * *